(12) United States Patent
Fukasaku et al.

(10) Patent No.: US 10,522,357 B2
(45) Date of Patent: Dec. 31, 2019

(54) TRANSISTOR, PROTECTION CIRCUIT, AND METHOD OF MANUFACTURING TRANSISTOR

(71) Applicant: SONY SEMICONDUCTOR SOLUTIONS CORPORATION, Kanagawa (JP)

(72) Inventors: Katsuhiko Fukasaku, Kanagawa (JP); Takaaki Tatsumi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/548,493

(22) PCT Filed: Dec. 10, 2015

(86) PCT No.: PCT/JP2015/084598
§ 371 (c)(1),
(2) Date: Aug. 3, 2017

(87) PCT Pub. No.: WO2016/129173
PCT Pub. Date: Aug. 18, 2016

(65) Prior Publication Data
US 2018/0240673 A1    Aug. 23, 2018

(30) Foreign Application Priority Data
Feb. 12, 2015   (JP) ................................ 2015-025337

(51) Int. Cl.
*H01L 21/28*      (2006.01)
*H01L 21/8234*    (2006.01)
(Continued)

(52) U.S. Cl.
CPC ........ *H01L 21/28* (2013.01); *H01L 21/28105* (2013.01); *H01L 21/8234* (2013.01);
(Continued)

(58) Field of Classification Search
CPC ..... H01L 27/088; H01L 29/49; H01L 29/423; H01L 27/06; H01L 21/8234; H01L 29/78
See application file for complete search history.

(56) References Cited

U.S. PATENT DOCUMENTS 5,593,909 A * 1/1997 Han ................... H01L 21/28105
257/E21.196
5,977,591 A * 11/1999 Fratin ............... H01L 21/28105
257/344

(Continued)

FOREIGN PATENT DOCUMENTS

| JP | 07-183500 A | 7/1995 |
|---|---|---|
| JP | 2004-253541 A | 9/2004 |
| JP | 2004-281843 A | 10/2004 |
| JP | 2012-253241 A | 12/2012 |
| JP | 2013-514663 A | 4/2013 |

OTHER PUBLICATIONS

International Search Report prepared by the Japan Patent Office dated Jan. 13, 2016, for International Application No. PCT/JP2015/084598.

*Primary Examiner* — Karen Kusumakar
(74) *Attorney, Agent, or Firm* — Sheridan Ross P.C.

(57) ABSTRACT

Both an improvement of on-current and suppression of leakage current of a transistor are achieved. A transistor includes a drain, a source, a gate, and a gate insulating film. In the transistor, the gate insulating film is disposed between the source and the drain. In addition, in the transistor, the gate has a plurality of regions provided on a surface of the gate insulating film. In addition, in the gate, the plurality of regions provided on the gate insulating film have different work functions.

20 Claims, 22 Drawing Sheets

(51) Int. Cl.
*H01L 29/423* (2006.01)
*H01L 29/49* (2006.01)
*H01L 29/78* (2006.01)
*H01L 27/06* (2006.01)
*H01L 27/088* (2006.01)
*H01L 29/66* (2006.01)
*H01L 27/02* (2006.01)

(52) U.S. Cl.
CPC ......... *H01L 27/0266* (2013.01); *H01L 27/06* (2013.01); *H01L 27/088* (2013.01); *H01L 29/423* (2013.01); *H01L 29/49* (2013.01); *H01L 29/495* (2013.01); *H01L 29/4916* (2013.01); *H01L 29/4983* (2013.01); *H01L 29/6659* (2013.01); *H01L 29/66545* (2013.01); *H01L 29/66659* (2013.01); *H01L 29/78* (2013.01); *H01L 29/7833* (2013.01)

(56) References Cited

U.S. PATENT DOCUMENTS

| | | | | |
|---|---|---|---|---|
| 7,545,007 B2* | 6/2009 | Greer | ................. | H01L 27/0811 |
| | | | | 257/386 |
| 8,735,983 B2* | 5/2014 | Liu | .................... | H01L 29/4983 |
| | | | | 257/344 |
| 2001/0017390 A1* | 8/2001 | Long | ................ | H01L 21/28105 |
| | | | | 257/368 |
| 2004/0183119 A1* | 9/2004 | Negoro | ............ | H01L 21/82345 |
| | | | | 257/314 |
| 2008/0308870 A1* | 12/2008 | Faul | ................ | H01L 27/10838 |
| | | | | 257/368 |
| 2011/0147837 A1* | 6/2011 | Hafez | ............. | H01L 21/823842 |
| | | | | 257/338 |
| 2012/0307410 A1* | 12/2012 | Yamazaki | ....... | H01L 21/823842 |
| | | | | 361/88 |

* cited by examiner a b a b c a b a b a b c a b c a b c

# TRANSISTOR, PROTECTION CIRCUIT, AND METHOD OF MANUFACTURING TRANSISTOR

CROSS REFERENCE TO RELATED APPLICATIONS

This application is a national stage application under 35 U.S.C. 371 and claims the benefit of PCT Application No. PCT/JP2015/084598 having an international filing date of 10 Dec. 2015, which designated the United States, which PCT application claimed the benefit of Japanese Patent Application No. 2015-025337 filed 12 Feb. 2015, the disclosures of which are incorporated herein by reference in their entirety.

TECHNICAL FIELD

The present technology relates to a transistor, a protection circuit, and a method of manufacturing a transistor. More specifically, the present technology relates to a transistor, a protection circuit, and a method of manufacturing a transistor which are used to protect a circuit from electrostatic discharge.

BACKGROUND ART

Conventionally, an electronic device uses an electrostatic discharge protection circuit to protect an internal circuit from electrostatic discharge. For example, there is proposed an electrostatic discharge protection circuit including: an RC circuit composed of a capacitive element and a resistor; and a transistor (see, for example, Patent Document 1). In the electrostatic discharge protection circuit, when a high-voltage pulse resulting from electrostatic discharge is generated over a shorter pulse period than the delay time of the RC circuit, the transistor transitions to an on state and emits a current resulting from the high-voltage pulse to a ground. As a result, a circuit to be protected can be protected from the electrostatic discharge. In the electrostatic discharge protection circuit, it is desirable that the on-current of the transistor be sufficiently large in terms of improving discharge capability. In addition, it is desirable to suppress the off-current (leakage current) of the transistor to a small value in terms of reducing power consumption.

CITATION LIST

Patent Document

Patent Document 1: Japanese Patent Application Laid-Open No. 2012-253241

SUMMARY OF THE INVENTION

Problems to be Solved by the Invention

However, in the above-described conventional technology, it is difficult to adjust the on-current and the leakage current. If the gate width of the transistor is increased, then the on-current improves, but the leakage current also increases. On the other hand, if the gate width of the transistor is reduced, then the leakage current decreases, but the on-current also decreases. As such, there is a problem that it is difficult to achieve both the improvement of on-current and suppression of leakage current of the transistor.

The present technology is made in view of such circumstances, and an object of the present technology is to achieve both the improvement of on-current and suppression of leakage current of the transistor.

Solutions to Problems

The present technology is made for solving the above problem, and a first aspect thereof is a transistor including: a source; a drain; a gate insulating film disposed between the source and the drain; and a gate provided on a surface of the gate insulating film and having a plurality of regions with different work functions. This brings about a function that a potential difference occurs at a boundary between the plurality of regions with different work functions.

In addition, in the first aspect, the plurality of regions may include two regions. This brings about a function that a potential difference occurs at a boundary between the two regions.

In addition, in the first aspect, one of the two regions may be an N-type semiconductor region disposed on a side of the drain, another one of the two regions may be a P-type semiconductor region disposed on a side of the source, and the drain and the source may be formed of N-type semiconductors. This brings about a function that a potential difference occurs at a boundary between the two regions in an N-type field effect transistor.

In addition, in the first aspect, one of the two regions may be an N-type semiconductor region disposed on a side of the source, another one of the two regions may be a P-type semiconductor region disposed on a side of the drain, and the drain and the source may be formed of P-type semiconductors. This brings about a function that a potential difference occurs at a boundary between the two regions in a P-type field effect transistor.

In addition, in the first aspect, the plurality of regions may include a drain-side region disposed on a side of the drain, a source-side region disposed on a side of the source, and an intermediate region disposed between the drain-side region and the source-side region. This brings about a function that potential differences occur at boundaries between the drain-side region and the source-side region and the intermediate region.

In addition, in the first aspect, the drain-side region and the source-side region and the source and the drain may be formed of N-type semiconductors, and the intermediate region may be formed of a P-type semiconductor. This brings about a function that potential differences occur at boundaries between the drain-side region and the source-side region and the intermediate region in an N-type field effect transistor.

In addition, in the first aspect, the drain-side region and the source-side region and the source and the drain may be formed of P-type semiconductors, and the intermediate region may be formed of an N-type semiconductor. This brings about a function that potential differences occur at boundaries between the drain-side region and the source-side region and the intermediate region in a P-type field effect transistor.

In addition, in the first aspect, the drain-side region and the source-side region may have different areas. This brings about a function that potential differences occur at boundaries between the drain-side region and the source-side region that have different areas and the intermediate region.

In addition, in the first aspect, the plurality of regions may be formed of metals with different work functions. This brings about a function that a potential difference occurs at a boundary between the plurality of regions formed of metals with different work functions.

In addition, a second aspect of the present technology is a protection circuit including: a power line connected to a power supply; a ground line with a predetermined potential; a source connected to the power line; a drain connected to the ground line; a gate insulating film disposed between the source and the drain; and a gate provided on a surface of the gate insulating film and having a plurality of regions with different work functions. This brings about a function that a potential difference occurs at a boundary between the plurality of regions with different work functions.

In addition, in the second aspect, a capacitive element that delays an electrical signal input through the power line may be further included, and the delayed electrical signal may be input to the gate. This brings about a function that a delayed electrical signal is input to the gate.

In addition, a second aspect of the present technology is a method of manufacturing a transistor, the method including: a silicon layer forming step of forming a silicon layer on a gate insulating film on a surface of a semiconductor substrate; a first adding step of adding a predetermined impurity to a part of the silicon layer and a predetermined region of the semiconductor substrate; and a second adding step of adding an impurity different than the predetermined impurity to a portion of the silicon layer excluding the part. This brings about a function that a transistor including a gate having a plurality of semiconductor regions is manufactured.

In addition, a third aspect of the present technology is a method of manufacturing a transistor, the method including: a first depositing step of depositing a predetermined metal on a gate insulating film on a surface of a semiconductor substrate; an etching step of removing, by etching, the predetermined metal such that a part of the predetermined metal remains; and a second depositing step of depositing a metal different than the predetermined metal on a surface of the gate insulating film. This brings about a function that a transistor including a gate having a plurality of metal regions is manufactured.

Effects of the Invention

According to the present technology, an excellent effect of being able to achieve both the improvement of on-current and reduction of leakage current of the transistor can be provided. Note that the effect is not necessarily limited to that described here and may be any of the effects described in the present disclosure.

MODE FOR CARRYING OUT THE INVENTION

Figure 1:
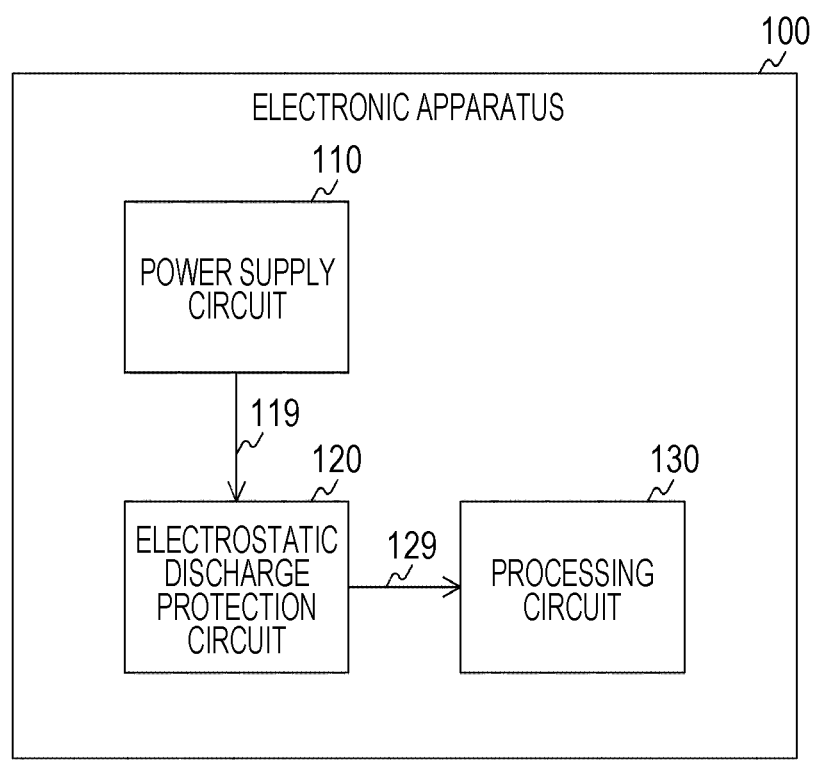
FIG. 1 is a block diagram showing an exemplary configuration of an electronic apparatus in a first embodiment.

Modes for carrying out the present technology (hereinafter, referred to as embodiments) will be described below. The description is made in the following order:
1. First embodiment (an example in which a gate has two semiconductor regions)
2. Second embodiment (an example in which a gate has three semiconductor regions)
3. Third embodiment (an example in which a gate has three metal regions)
<1. First Embodiment>
[Exemplary Configuration of an Electronic Apparatus]
FIG. 1 is a block diagram showing an exemplary configuration of an electronic apparatus 100 in a first embodiment. The electronic apparatus 100 includes a power supply circuit 110, an electrostatic discharge protection circuit 120, and a processing circuit 130.

The power supply circuit 110 is to supply power to the electrostatic discharge protection circuit 120 through a power line 119. The electrostatic discharge protection circuit 120 is to supply the power from the power supply circuit 110, to the processing circuit 130 through a power line 129, and to protect the processing circuit 130 from electrostatic discharge (ESD). The processing circuit 130 is to perform a predetermined process using the power from the electrostatic discharge protection circuit 120. Note that the electrostatic discharge protection circuit 120 is an example of a protection circuit recited in the claims.

[Electrostatic Discharge Protection Circuit]

Figure 2:
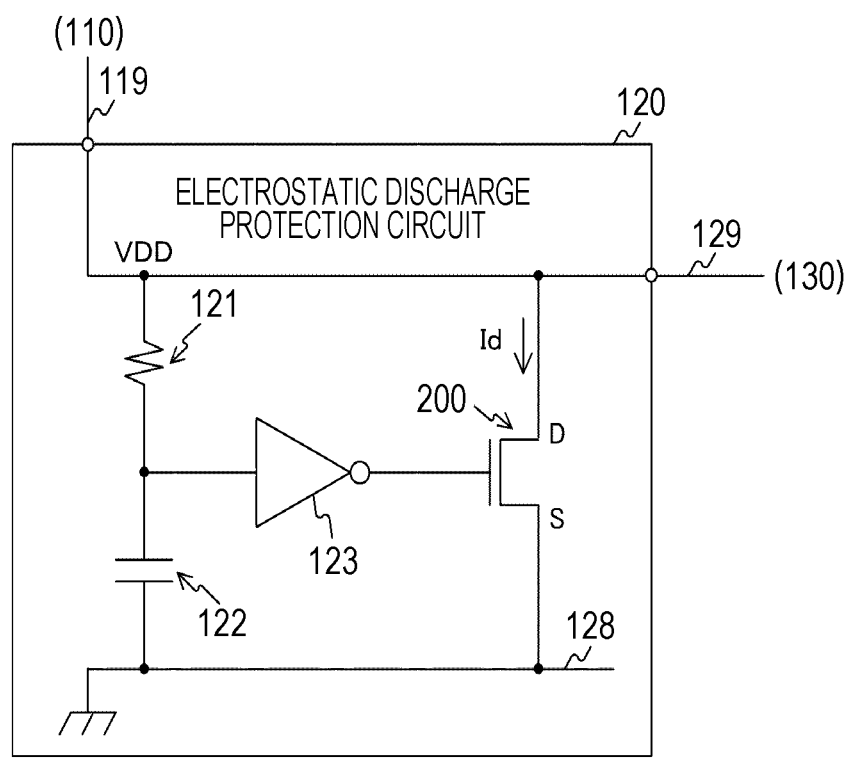
FIG. 2 is a circuit diagram showing an exemplary configuration of an electrostatic discharge protection circuit in the first embodiment.

FIG. 2 is a circuit diagram showing an exemplary configuration of the electrostatic discharge protection circuit 120 in the first embodiment. The electrostatic discharge protection circuit 120 includes a resistor 121, a capacitive element 122, an inverter 123, and a field effect transistor 200.

One end of the resistor 121 is connected to the power lines 119 and 129 and the field effect transistor 200, and the other end is connected to the capacitive element 122 and the inverter 123. One end of the capacitive element 122 is connected to the resistor 121 and the inverter 123, and the other end is connected to a ground with a ground potential through a ground line 128. As the capacitive element 122, a gate insulating film of a transistor (not shown) different than the field effect transistor 200, a parallel plate between wiring layers, or the like, is used.

In addition, the time constant of an RC circuit composed of the capacitive element 122 and the resistor 121 is set to be a longer period of time than a pulse period of a high-voltage pulse which is generated by electrostatic discharge. For example, by the 1-megohm resistor 121 and the 1-picofarad capacitive element 122, the time constant is set to one microsecond. Here, the capacitance of the capacitive element 122 is adjusted by the magnitude of element size, etc.

An input terminal of the inverter 123 is connected to a connection point between the resistor 121 and the capacitive element 122, and an output terminal is connected to a gate of the field effect transistor 200. The gate of the field effect transistor 200 is connected to the inverter 123, a source is connected to the ground, and a drain is connected to the power lines 119 and 129 and the resistor 121.

The inverter 123 connected in this manner outputs a high-level signal when a high-voltage pulse whose pulse period is shorter than the time constant of the RC circuit is input through the power line 119. By this signal, the field effect transistor 200 transitions to an on state. The field effect transistor 200 in the on state discharges a drain current resulting from the high-voltage pulse to the ground, and thereby protects the processing circuit 130 from the high-voltage pulse. In terms of improving discharge capability, a larger on-current which is a drain current in an on state is desirable.

In addition, when a certain power supply voltage VDD is applied, the inverter 123 outputs a low-level signal and the field effect transistor 200 transitions to an off state. In the off state, for example, in a case where the gate voltage of the field effect transistor 200 is smaller than the drain voltage, a leakage current may flow. The leakage current thus induced by the gate is particularly called a gate-induced drain leakage (GIDL) current. In terms of reducing power consumption, it is desirable that the leakage current (GIDL current, etc.) be less than or equal to an allowable value.

Figure 3:
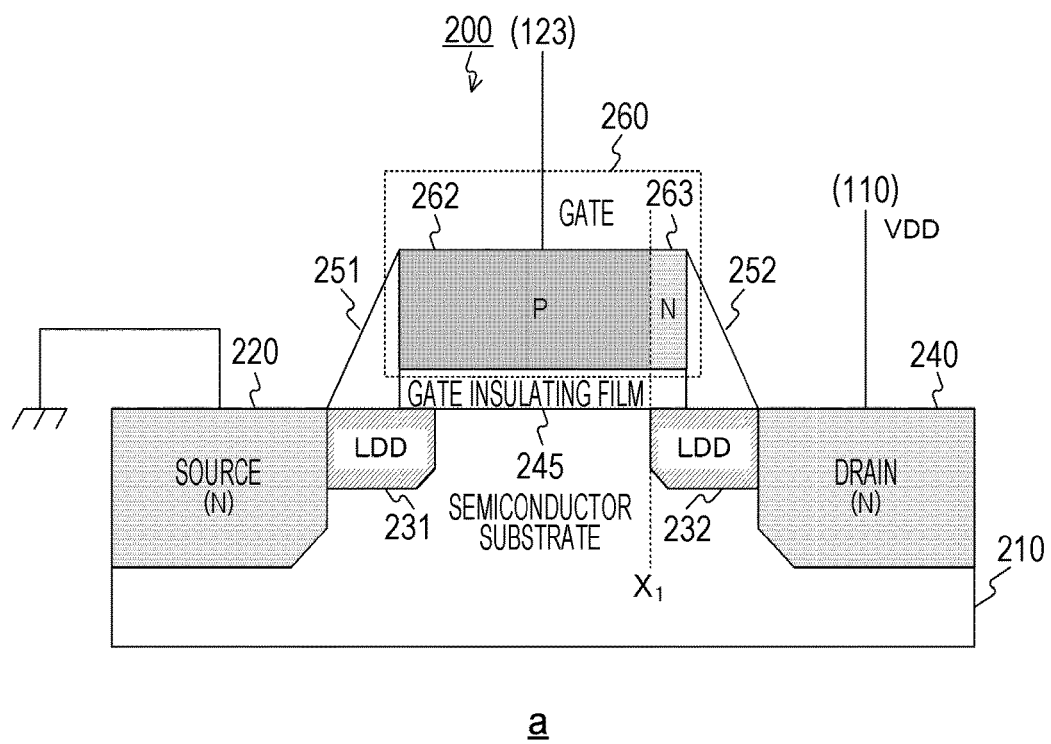
FIG. 3 is an example of a cross-sectional view of a field effect transistor in the first embodiment.
Figure 3:
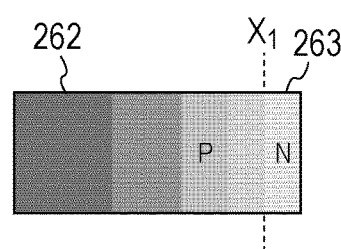

[Exemplary Configuration of the Field Effect Transistor]

a of FIG. 3 is an example of a cross-sectional view of the field effect transistor 200 in the first embodiment. The cross-sectional view shows a cross-section along a plane parallel to both of a direction from the source to drain of the field effect transistor 200 and a direction perpendicular to a substrate plane of a semiconductor substrate where the field effect transistor 200 is formed.

The field effect transistor 200 includes a source 220, a drain 240, sidewall spacers 251 and 252, a gate insulating film 245, and a gate 260.

The source 220 and the drain 240 are formed in a semiconductor substrate 210. These source 220 and drain 240 are formed of N-type semiconductors, and the semiconductor substrate 210 is formed of a P-type semiconductor. In addition, the gate insulating film 245 with a high dielectric constant (high-k) is provided on a portion of a surface of the semiconductor substrate 210 between the source 220 and the drain 240. In addition, the gate 260 is provided on a surface of the gate insulating film 245, and lightly doped drains (LDDs) 231 and 232 are formed in portions of the semiconductor substrate 210 underneath the gate insulating film 245. By the formation of the lightly doped drains, deterioration of the gate insulating film 245 by hot carrier can be suppressed.

The gate 260 has a plurality of semiconductor regions with different work functions which are energy required to extract an electron from a surface to infinity. For example, the gate 260 is composed of a P-type semiconductor region 262 and a drain-side N-type semiconductor region 263. In addition, the sidewall spacer 251 is provided on side surfaces, on the side of the source 220, of the gate 260 and the gate insulating film 245, and the sidewall spacer 252 is provided on side surfaces, on the side of the drain 240, of the gate 260 and the gate insulating film 245.

The drain-side N-type semiconductor region 263 is provided in a region ranging from an edge, on the side of the drain 240, of the gate insulating film 245 to a boundary position $X_1$ on the surface of the gate insulating film 245. In addition, the P-type semiconductor region 262 is provided in a region ranging from an edge, on the side of the source 220, of the gate insulating film 245 to the boundary position $X_1$. The boundary position $X_1$ is, for example, a position that substantially matches the position of a boundary between the lightly doped drain 232 and the semiconductor substrate 210.

b of FIG. 3 is a diagram showing an example of an impurity concentration gradient of the gate 260. In the gate 260, upon doping impurities, the impurities diffuse and thus an impurity concentration gradient occurs in a direction from the source 220 to the drain 240. Here, the closer it is to the source 220 the higher the acceptor concentration is, and the closer it is to the drain 240 the higher the donor concentration is. The gate 260 where this concentration gradient occurs is separated into the P-type semiconductor region 262 and the drain-side N-type semiconductor region 263 by the boundary position $X_1$ where the acceptor or donor concentration has a predetermined value.

Since the gate 260 thus has two regions (262 and 263) with different work functions, a potential difference $V_d$ shown in the following equation occurs at the boundary position $X_1$ thereof:

[Mathematical Formula 1]

$$qV_d = \phi_P - \phi_N \qquad \text{equation 1}$$

In the above equation, q is the unit charge. In addition, the first term on the right side is the work function of the P-type semiconductor region 262, and the second term is the work function of the drain-side N-type semiconductor region 263. The unit of these work functions is, for example, electron-volt (eV).

By equation 1, the potential of the P-type semiconductor region 262 on the side of the source 220 is higher than that of the drain-side N-type semiconductor region 263. Since a potential difference thus occurs in a direction in which a leakage current from the drain 240 to the source 220 is prevented from flowing, the leakage current is reduced.

Figure 4:
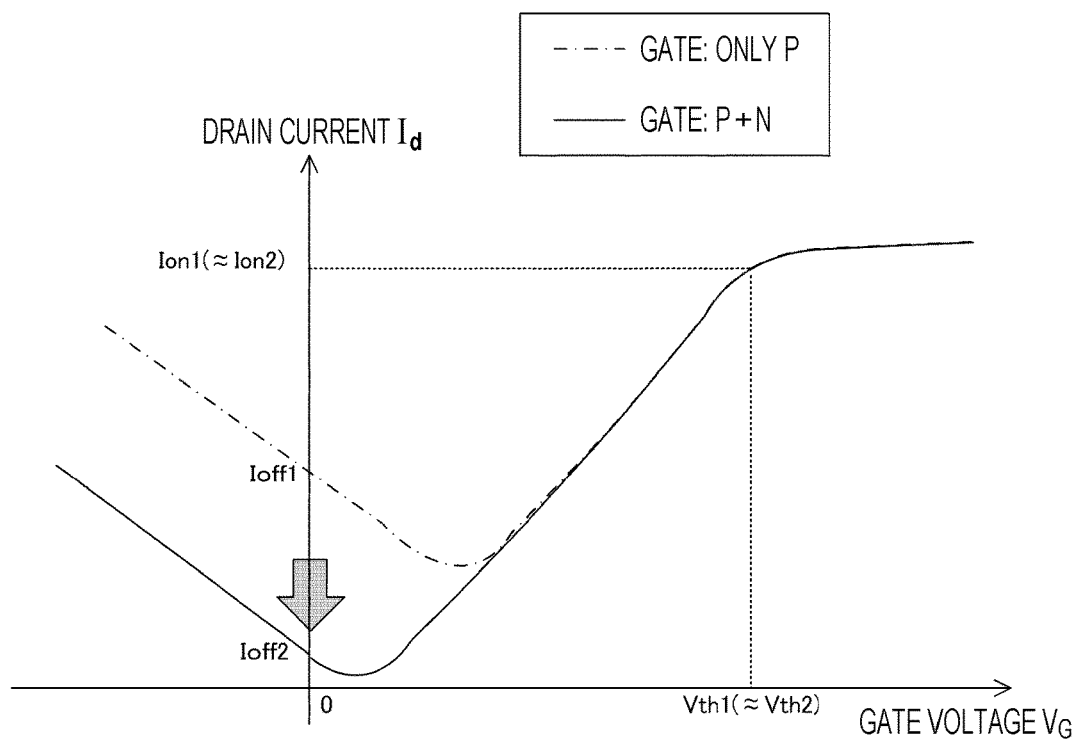
FIG. 4 is a graph showing a characteristic of the field effect transistor in the first embodiment.

FIG. 4 is a graph showing a characteristic of the field effect transistor 200 in the first embodiment. A vertical axis in the drawing represents drain current $I_d$ and a horizontal axis represents gate voltage $V_G$. In addition, a dash-dotted line indicates a characteristic of a field effect transistor of a comparative example where a gate is formed of only a P-type semiconductor, and a solid line indicates a characteristic of the field effect transistor 200 where the gate 260 is provided with the P-type semiconductor region 262 and the drain-side N-type semiconductor region 263. Comparing the comparative example with the characteristic of the field effect transistor 200, an on-current $I_{on2}$ of the field effect transistor 200 is comparable to an on-current $I_{on1}$ of the comparative example. On the other hand, a leakage current $I_{off2}$ of the field effect transistor 200 is smaller than a leakage current $I_{off1}$ of the comparative example. This is due to the fact that, as described above, the potential of the P-type semiconductor region 262 with a relatively high work function is higher than that of the drain-side N-type semiconductor region 263.

Figure 5:
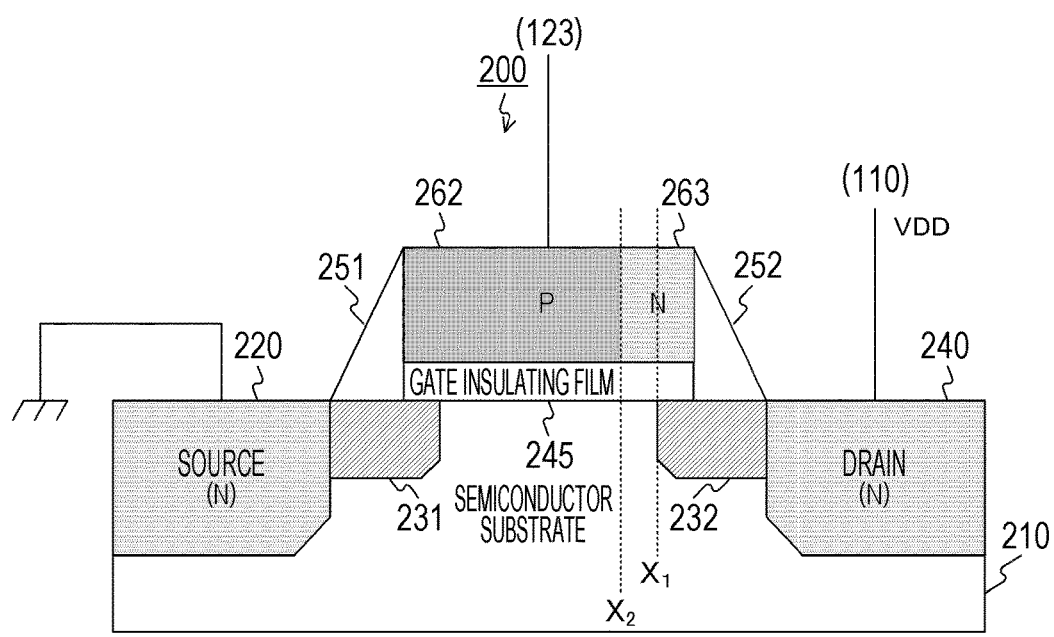
FIG. 5 is an example of a cross-sectional view of a field effect transistor in which the area of a drain-side N-type semiconductor region is increased in the first embodiment.

FIG. 5 is an example of a cross-sectional view of a field effect transistor 200 in which the area of a drain-side N-type semiconductor region 263 is increased in the first embodiment. Here, the area of the drain-side N-type semiconductor region 263 indicates an area of a surface of a gate insulating film 245 that is occupied by the drain-side N-type semiconductor region 263. For example, a distance from an end, on the side of a drain 240, of the gate insulating film 245 to a boundary position $X_1$ is d, and a length of a gate 260 in a direction perpendicular to a direction from a source 220 to the drain 240 is a gate width W. In this case, the area of the drain-side N-type semiconductor region 263 is d×W. In the drawing, the area of the drain-side N-type semiconductor region 263 is larger than that for the case of FIG. 3, and the boundary position thereof is adjusted to $X_2$ which is more on the side of the source 220 than $X_1$ is.

Here, in the field effect transistor 200, an on-current $I_{on}$ is represented by the following equation:

$$I_{on} = C_{ox}(V_G - V_{th} - \tfrac{1}{2} \times V_D) \times V_D / L \times W \times u \qquad \text{equation 2}$$

In the above equation, $C_{ox}$ is the capacitance of the gate insulating film 245 and its unit is, for example, farad (F). In addition, $V_G$ is the gate voltage and $V_{th}$ is the threshold voltage. $V_D$ is the drain voltage. The unit of these voltages is, for example, volt (V). L is the gate length indicating the gate length of the gate 260 in the direction from the source 220 to the drain 240, and W is the gate width. The unit of L and W is, for example, meter (m). u is the charge mobility and its unit is, for example, square meter per volt-second (m²/V·s).

In addition, the threshold voltage $V_{th}$ of the field effect transistor 200 in equation 2 is generally represented by the following equation:

[Mathematical Formula 2]

$$V_{th} = V_{fb} + 2\psi_b + \frac{\sqrt{4\varepsilon_{si} q N_a \psi_b}}{C_{ox}} \qquad \text{equation 3}$$

In the above equation, $V_{fb}$ is the flat-band voltage and its unit is, for example, volt (V). The second term on the right side is the depth of the donor level and its unit is, for example, joule (J). Epsilon is the permittivity of silicon. $N_a$ is the impurity concentration of the substrate and its unit is, for example, per cubic meter (m⁻³).

In addition, the flat-band voltage $V_{fb}$ in equation 3 is represented by the following equations:

[Mathematical Formula 3]

$$V_{fb} = \phi_G - \phi_S + \frac{q}{C_{ox}} \qquad \text{equation 4}$$

[Mathematical Formula 4]

$$\phi_G = \phi_P + \phi_N \qquad \text{equation 5}$$

The first term on the right side of equation 4 is the work function of the gate 260 and the second term is the work function of a semiconductor substrate 210. In addition, the first term on the right side of equation 5 is the work function of a P-type semiconductor region 262 and the second term is the work function of the drain-side N-type semiconductor region 263.

With the area of the gate insulating film 245 being fixed, as the area of the drain-side N-type semiconductor region 263 within the gate insulating film 245 increases, the amount of donor added increases, and thus, the work function of the drain-side N-type semiconductor region 263 increases. On the other hand, the area of the P-type semiconductor region 262 on the gate insulating film 245 decreases, and thus, the amount of acceptor added decreases and the work function of the P-type semiconductor region 262 decreases. Since the work function of the P-type semiconductor region 262 that has a relatively large value decreases and the work function of the drain-side N-type semiconductor region 263 that has a small value increases, by equation 5 the work function of the gate 260 which is obtained by adding those work functions together decreases. If the work function of the gate 260 decreases, then by equation 4 the flat-band voltage $V_{fb}$ decreases. If the flat-band voltage $V_{fb}$ decreases, then by equation 3 the threshold voltage $V_{th}$ decreases. If the threshold voltage $V_{th}$ decreases, then by equation 2 the on-current $I_{on}$ increases. That is, the larger the area of the drain-side N-type semiconductor region 263, the larger the on-current $I_{on}$.

Figure 6:
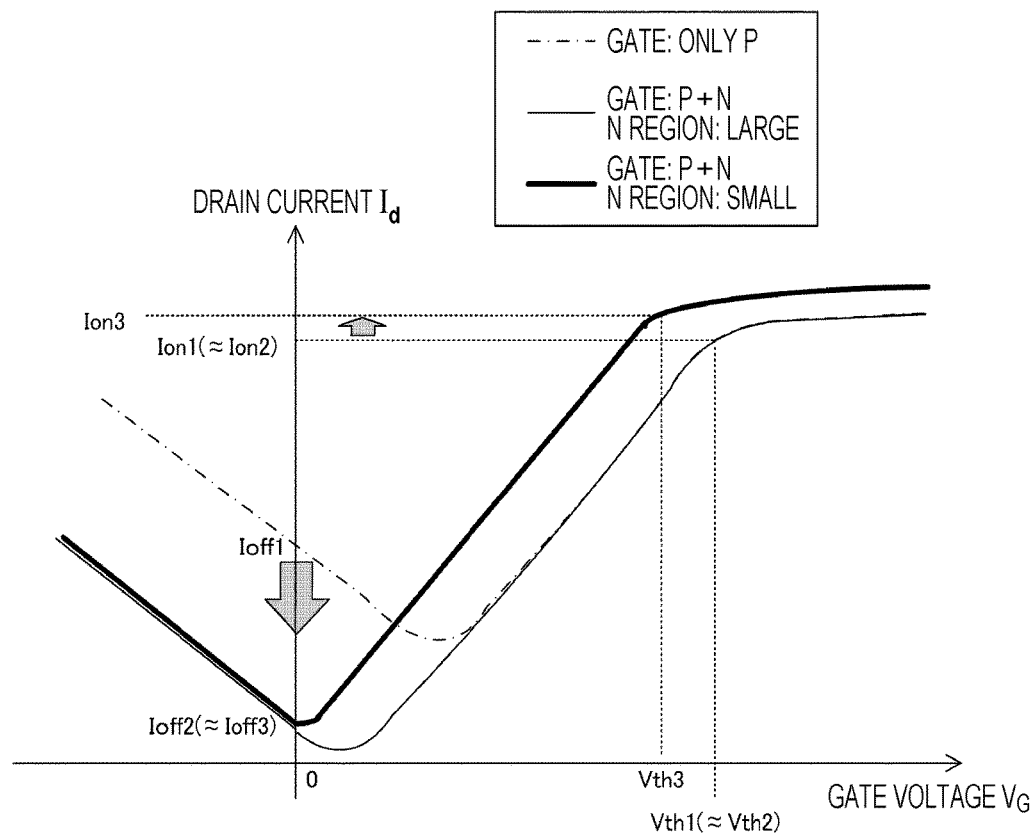
FIG. 6 is a graph showing an example of a characteristic of the field effect transistor in which the area of the drain-side N-type semiconductor region is increased in the first embodiment.

FIG. 6 is a graph showing a characteristic of the field effect transistor 200 in which the area of the drain-side N-type semiconductor region 263 is increased in the first embodiment. A vertical axis in the drawing represents drain current Id and a horizontal axis represents gate voltage VG. In addition, a thin solid line indicates a characteristic of the field effect transistor 200 with the boundary position X1, and a thick solid line indicates a characteristic of the field effect transistor 200 with the boundary position X2. As exemplified in the drawing, an on-current Ion3 for the case of the drain-side N-type semiconductor region 263 having a relatively large area is larger than an on-current Ion2 for the case of the drain-side N-type semiconductor region 263 having a relatively small area. Note that a leakage current Ioff3 for the case of the drain-side N-type semiconductor region 263 having a relatively large area is suppressed to a level comparable to a leakage current Ioff2 for the case of the drain-side N-type semiconductor region 263 having a relatively small area.

By thus adjusting the area of the drain-side N-type semiconductor region 263, both the improvement of on-current and suppression of leakage current of the field effect transistor 200 can be achieved.

On the other hand, a common metal oxide semiconductor (MOS) type field effect transistor having a gate composed of only a metal has difficulty in achieving both the improvement of on-current and the suppression of leakage current. By equation 2, the on-current can be improved by changing the gate length L and the gate width W, but at the same time the leakage current also increases. On the other hand, if the leakage current is reduced by changing the gate length L and the gate width W, then the on-current also decreases.

Figure 7:
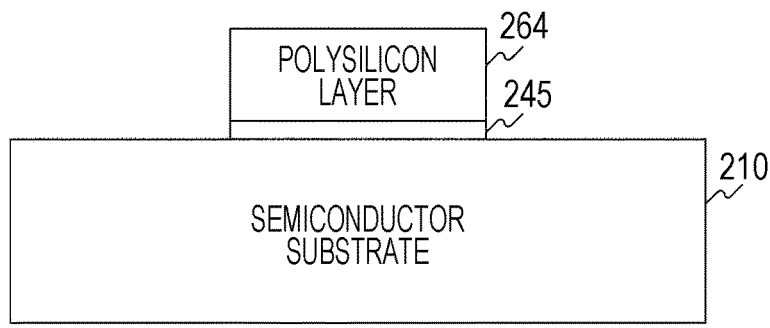
FIG. 7 is a diagram for describing a part of a manufacturing method up to the formation of sidewall spacers of a field effect transistor in the first embodiment.
Figure 7:
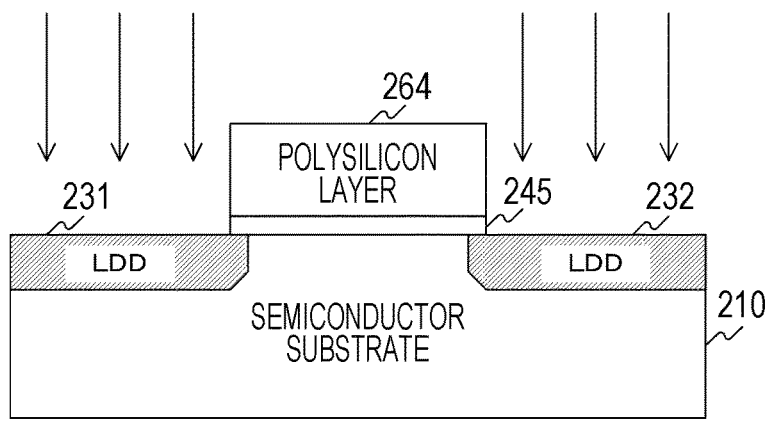
Figure 7:
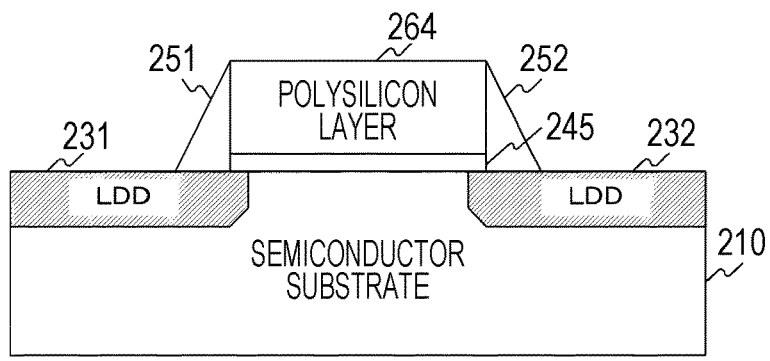

FIG. 7 is a diagram for describing a part of a manufacturing method up to the formation of the sidewall spacers 251 and 252 of the field effect transistor 200 in the first embodiment. As exemplified in a of the drawing, first, a deposition apparatus forms a gate insulating film 245 on a surface of a semiconductor substrate 210, and forms a polysilicon layer 264 on a surface of the gate insulating film 245.

Then, as exemplified in b of FIG. 7, anion implantation apparatus ionizes and implants donors such as arsenic, and thereby forms lightly doped drains 231 and 232 in the semiconductor substrate 210.

Then, as exemplified in c of FIG. 7, the deposition apparatus deposits an insulating film, and an etching apparatus performs isotropic etching on the insulating film. As a result, sidewall spacers 251 and 252 are formed on side surfaces of the gate insulating film 245 and the polysilicon layer 264.

Figure 8:
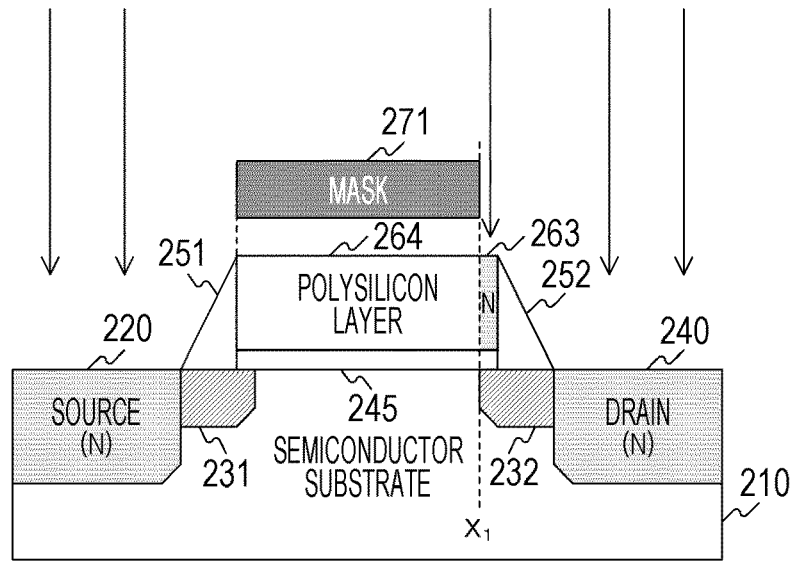
FIG. 8 is a diagram for describing a part of the manufacturing method after the formation of the sidewall spacers of the field effect transistor in the first embodiment.
Figure 8:
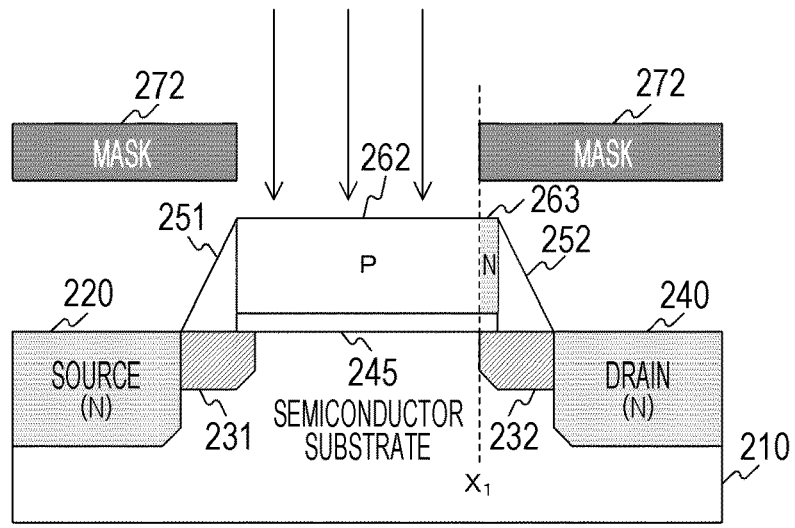

FIG. 8 is a diagram for describing a part of the manufacturing method after the formation of the sidewall spacers 251 and 252 of the field effect transistor 200 in the first embodiment. As exemplified in a of the drawing, an exposure apparatus patterns, by lithography, a mask 271 that covers a portion of the polysilicon layer 264 ranging from an edge, on the side of a source 220, of the gate insulating film 245 to a boundary position $X_1$. Then, the ion implantation apparatus implants ionized donors and thereby forms the source 220 and a drain 240 and a drain-side N-type semiconductor region 263.

Subsequently, as exemplified in b of FIG. 8, the exposure apparatus patterns, by lithography, a mask 272 having opening only where corresponding to the polysilicon layer 264 portion. Then, the ion implantation apparatus ionizes and implants acceptors into the polysilicon layer 264 and thereby forms a P-type semiconductor region 262. After this, the impurities are activated by heat treatment, by which wiring lines are connected to each of a gate 260, the source 220, and the drain 240.

Figure 9:
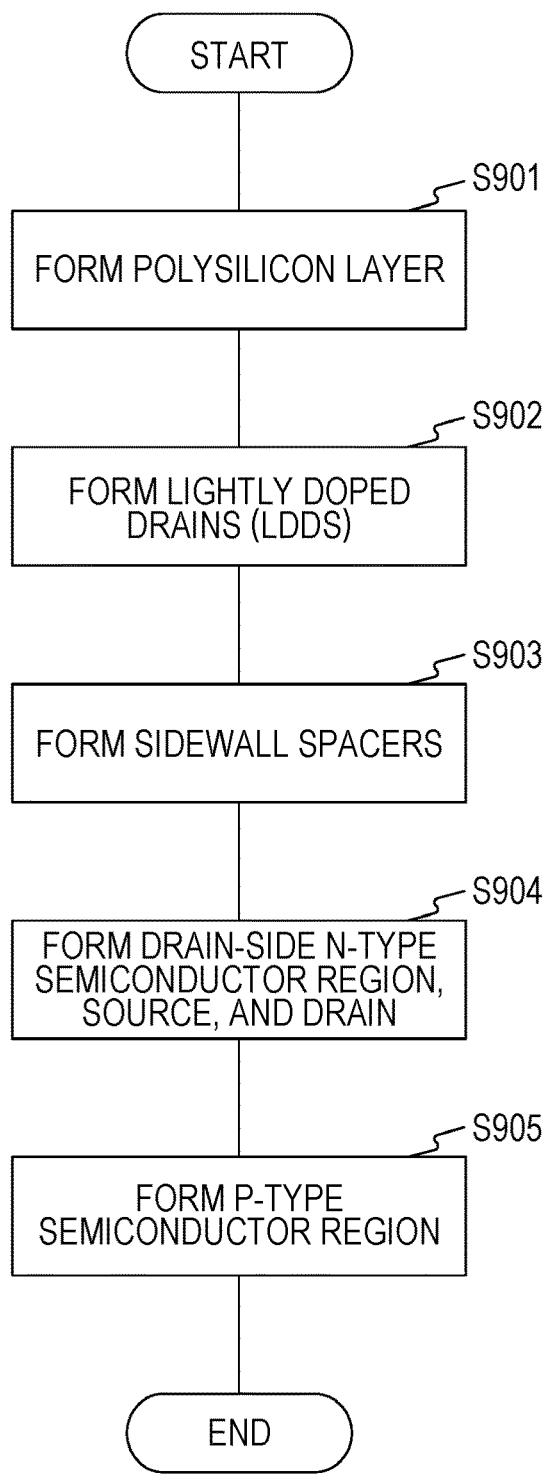
FIG. 9 is a flowchart showing an example of a method of manufacturing a field effect transistor in the first embodiment.

FIG. 9 is a flowchart showing an example of a method of manufacturing a field effect transistor in the first embodiment. A gate insulating film 245 is formed on a surface of a semiconductor substrate 210, and a polysilicon layer 264 is formed on a surface of the gate insulating film 245 (step S901). Then, by implantation of ionized donors, lightly doped drains 231 and 232 are formed in the semiconductor substrate 210 (step S902). Then, sidewall spacers 251 and 252 are formed by the deposition of an insulating film and isotropic etching (step S903). Subsequently, by implantation of ionized donors, a source 220 and a drain 240 and a drain-side N-type semiconductor region 263 are formed (step S904). Then, by implantation of ionized acceptors, a P-type semiconductor region 262 is formed (step S905). Note that although step S905 is performed after step S904, step S904 may be performed after step S905.

As such, according to the first embodiment of the present technology, since the gate 260 has two semiconductor regions with different work functions, a potential difference occurs at a boundary between the semiconductor regions, enabling to suppress the leakage current while the on-current is maintained.

[First Variant]

Although in the above-described first embodiment the N-type field effect transistor 200 is provided in the electrostatic discharge protection circuit 120, a P-type field effect transistor can also be provided instead. An electrostatic discharge protection circuit 120 of this first variant differs from that of the first embodiment in that a P-type field effect transistor is provided instead of an N-type.

Figure 10:
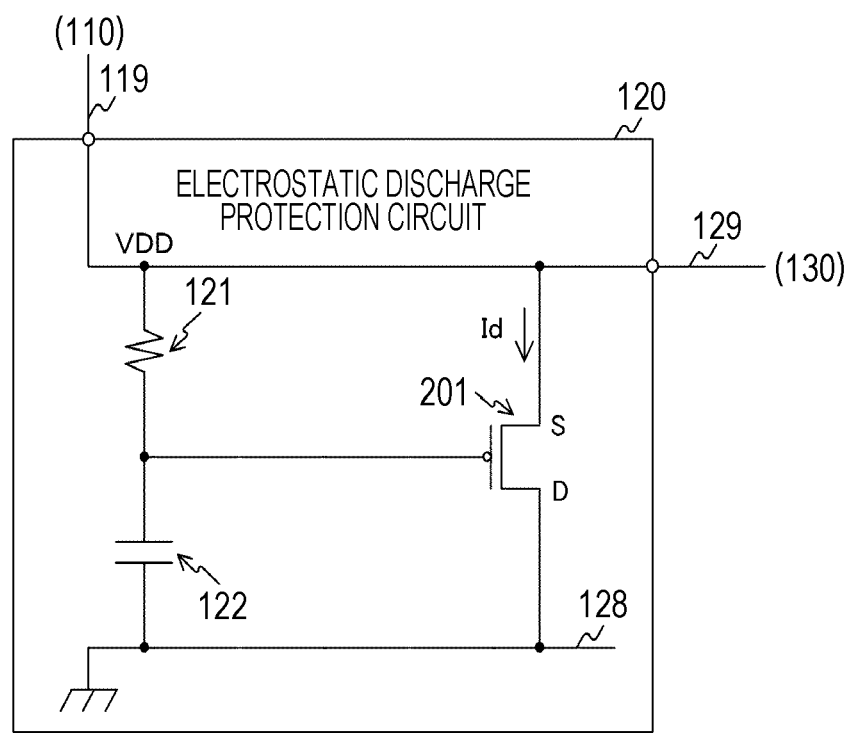
FIG. 10 is a circuit diagram showing an exemplary configuration of an electrostatic discharge protection circuit in a first variant of the first embodiment.

FIG. 10 is a circuit diagram showing an exemplary configuration of an electrostatic discharge protection circuit 120 in the first variant of the first embodiment. The electrostatic discharge protection circuit 120 of the first variant differs from that of the first embodiment in that the electrostatic discharge protection circuit 120 does not include an inverter 123 and includes a P-type field effect transistor 201 instead of an N-type field effect transistor 200.

A gate of the field effect transistor 201 is connected to a connection point between a resistor 121 and a capacitive element 122. In addition, a source of the field effect transistor 201 is connected to power lines 119 and 129, and a drain is connected to a ground.

Figure 11:
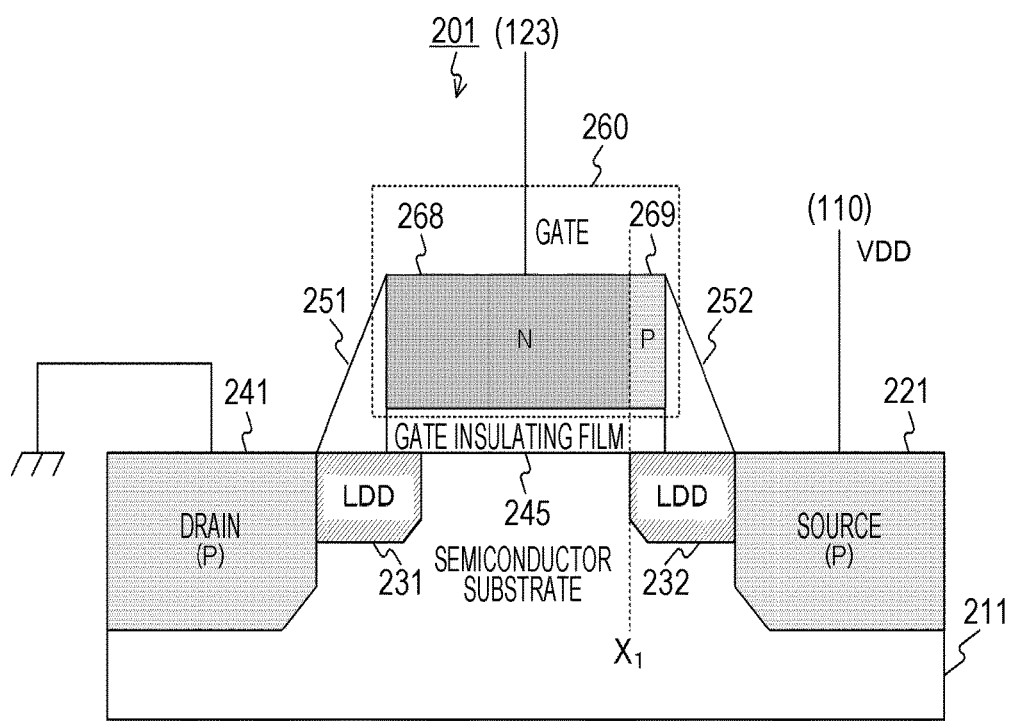
FIG. 11 is an example of a cross-sectional view of a field effect transistor in the first variant of the first embodiment.

FIG. 11 is an example of a cross-sectional view of the field effect transistor 201 in the first variant of the first embodiment. Instead of an N-type source 220 and drain 240, a P-type source 221 and drain 241 are provided in a semiconductor substrate 211. In addition, a source-side P-type semiconductor region 269 is formed in a region ranging from an end, on the side of the source 221, of a gate insulating film 245 to a boundary position $X_1$, and an N-type semiconductor region 268 is formed in a region ranging from an end, on the side of the drain 241, of the gate insulating film 245 to the boundary position $X_1$.

As such, according to the first variant, since the P-type field effect transistor 201 is provided, there is no need to provide an inverter 123 in the electrostatic discharge protection circuit 120.

[Second Variant]

Although in the above-described first embodiment the capacitive element 122 is provided on the ground side and a signal is inverted by the inverter 123, if the capacitive element 122 is provided on the power supply side, then there is no need to provide the inverter 123. An electrostatic discharge protection circuit 120 of this second variant of the first embodiment differs from that of the first embodiment in that the capacitive element 122 is provided on the power supply side.

Figure 12:
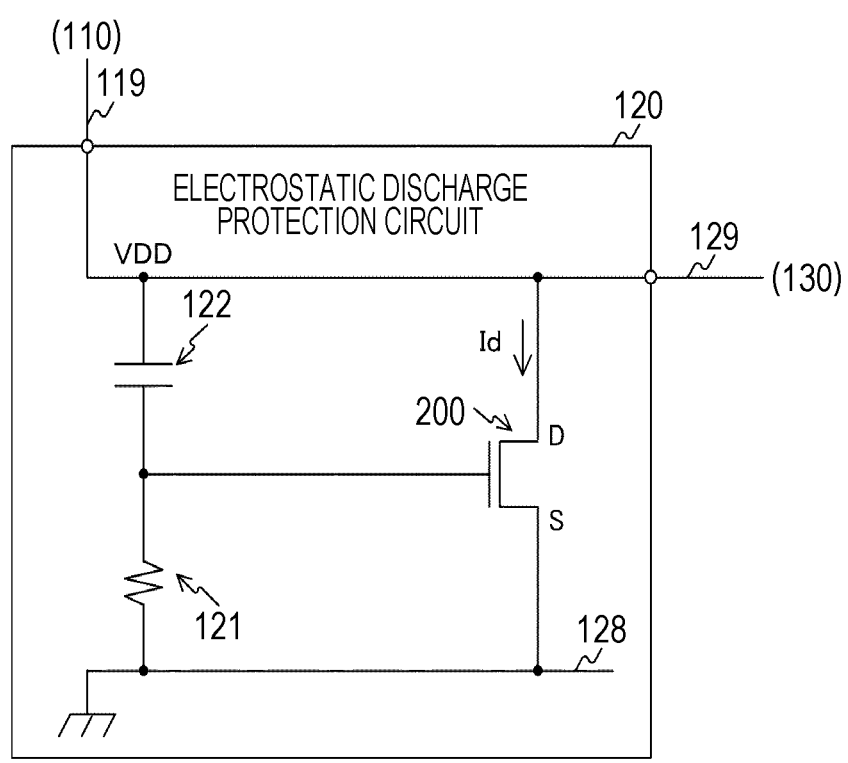
FIG. 12 is a circuit diagram showing an exemplary configuration of an electrostatic discharge protection circuit in a second variant of the first embodiment.

FIG. 12 is a circuit diagram showing an exemplary configuration of an electrostatic discharge protection circuit 120 in the second variant of the first embodiment. The electrostatic discharge protection circuit 120 of the second variant differs from that of the first embodiment in that the electrostatic discharge protection circuit 120 does not include an inverter 123.

In addition, one end of a capacitive element 122 of the second variant is connected to power lines 119 and 129, and the other end is connected to a resistor 121 and a gate of a field effect transistor 200. One end of the resistor 121 of the second variant is connected to the capacitive element 122 and the field effect transistor 200, and the other end is connected to a ground.

As such, according to the second variant, since the capacitive element 122 is provided on the power supply side, there is no need to provide an inverter 123 in the electrostatic discharge protection circuit 120.

[Third Variant]

Although in the above-described first embodiment an electrical signal is delayed by the resistor 121 and the capacitive element 122, in a case where a parasitic capacitance is formed in the field effect transistor 200, there is no need to provide the resistor 121 and the capacitive element 122. An electrostatic discharge protection circuit 120 of this third variant of the first embodiment differs from that of the first embodiment in that the electrostatic discharge protection circuit 120 does not include the resistor 121 and the capacitive element 122.

Figure 13:
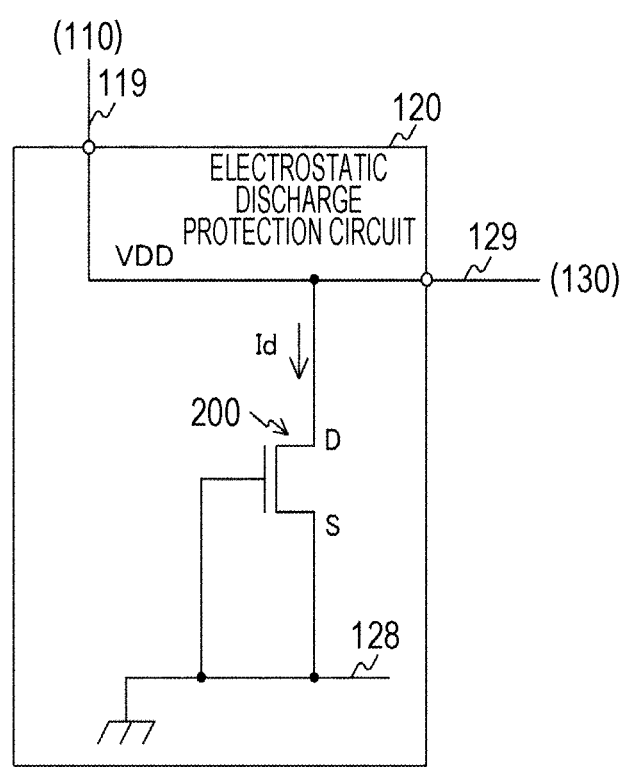
FIG. 13 is a circuit diagram showing an exemplary configuration of an electrostatic discharge protection circuit in a third variant of the first embodiment.

FIG. 13 is a circuit diagram showing an exemplary configuration of an electrostatic discharge protection circuit 120 in the third variant of the first embodiment. The electrostatic discharge protection circuit 120 of the third variant differs from that of the first embodiment in that the electrostatic discharge protection circuit 120 does not include a resistor 121 and a capacitive element 122 and a gate of a field effect transistor 200 is connected to a ground. In addition, a parasitic capacitance is formed at a back gate of the field effect transistor 200 of the third variant, and an electrical signal is delayed by the parasitic capacitance.

As such, according to the third variant, since an electrical signal is delayed by a parasitic capacitance of the field effect transistor 200, there is no need to provide a resistor 121 and a capacitive element 122 in the electrostatic discharge protection circuit 120.

<2. Second Embodiment>

Although in the above-described first embodiment two semiconductor regions are formed in a gate 260, three semiconductor regions may be formed in the gate 260. A field effect transistor 200 of this second embodiment differs from that of the first embodiment in that the gate 260 has three semiconductor regions.

Figure 14:
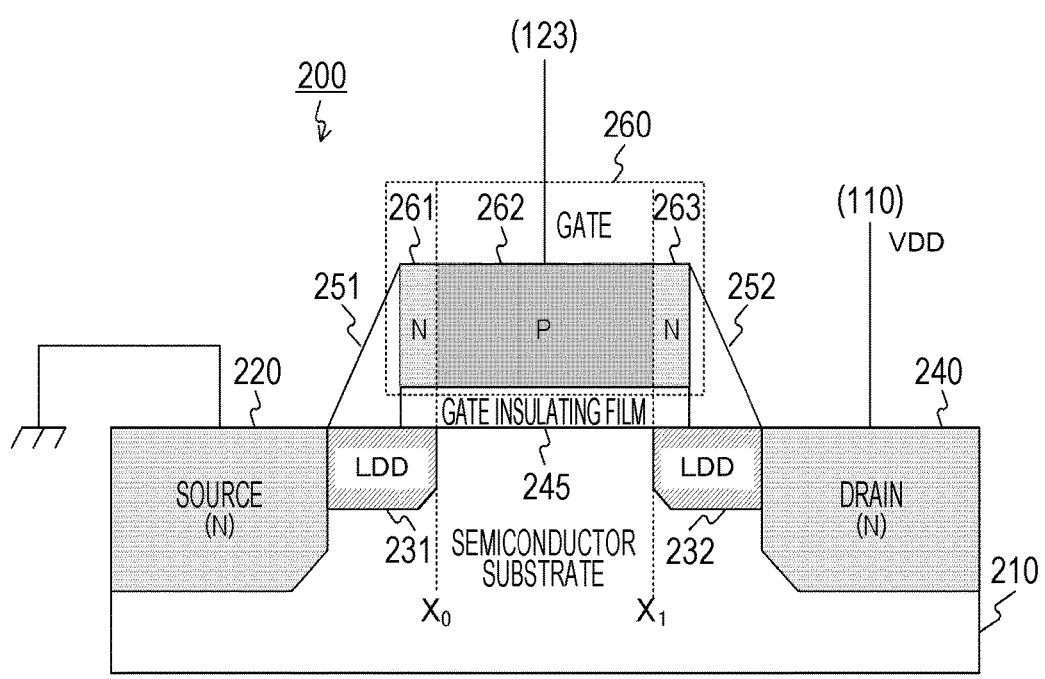
FIG. 14 is an example of a cross-sectional view of a field effect transistor in a second embodiment.

FIG. 14 is an example of a cross-sectional view of a field effect transistor 200 in the second embodiment. The field effect transistor 200 of the second embodiment differs from that of the first embodiment in that the field effect transistor 200 further has a source-side N-type semiconductor region 261.

The source-side N-type semiconductor region 261 is provided in a region ranging from an edge, on the side of a source 220, of a gate insulating film 245 to a boundary position $X_0$ on a surface of the gate insulating film 245. The boundary position $X_0$ is a position closer to the source 220 than a boundary position $X_1$ is, and substantially matches, for example, the position of a boundary between a lightly doped drain 231 and a semiconductor substrate 210.

Figure 15:
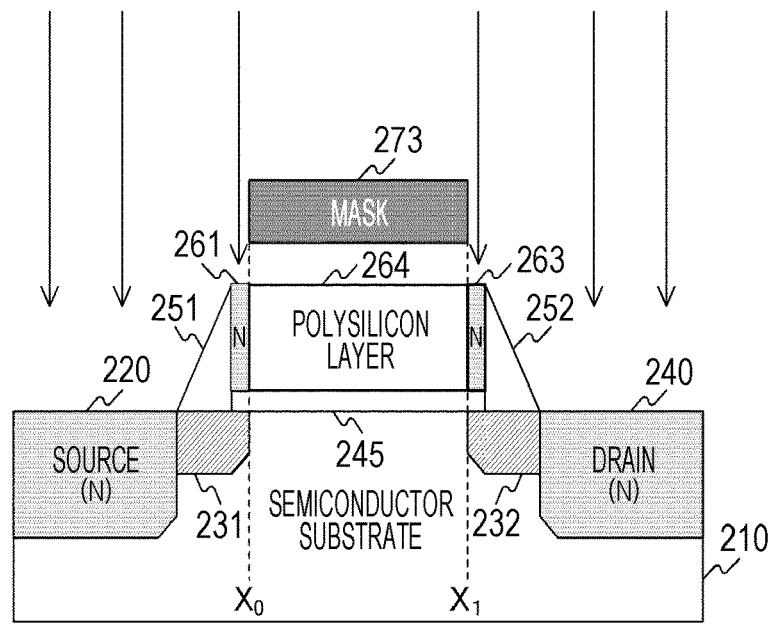
FIG. 15 is a diagram for describing a method of manufacturing the field effect transistor in the second embodiment.
Figure 15:
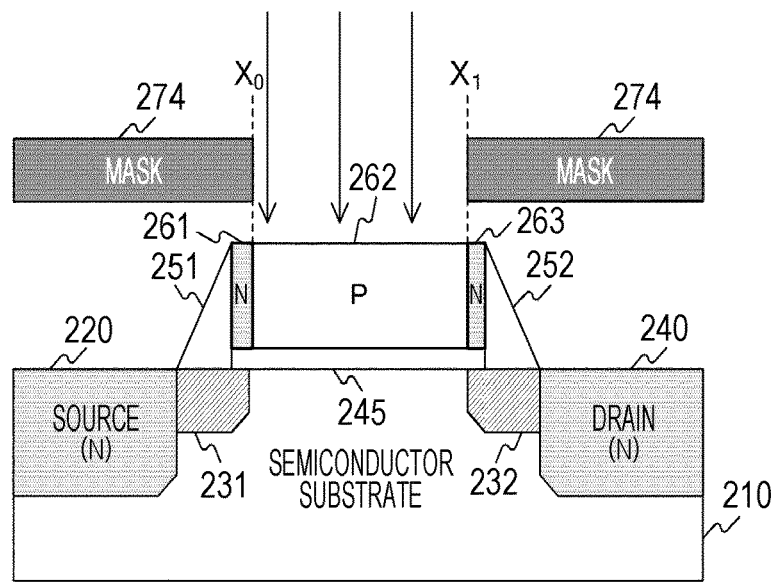

FIG. 15 is a diagram for describing a method of manufacturing the field effect transistor 200 in the second embodiment. After the formation of sidewall spacers 251 and 252, as exemplified in a of the drawing, an exposure apparatus patterns, by lithography, a mask 273 that covers a region ranging from a boundary position $X_0$ to a boundary position $X_1$. Then, an ion implantation apparatus ionizes and implants donors and thereby forms a source 220 and a drain 240, a source-side N-type semiconductor region 261, and a drain-side N-type semiconductor region 263.

Subsequently, as exemplified in b of FIG. 15, the exposure apparatus patterns, by lithography, a mask 274 having opening only where corresponding to a polysilicon layer 264 portion. Then, the ion implantation apparatus implants ionized acceptors into the polysilicon layer 264 and thereby forms a P-type semiconductor region 262.

In the second embodiment, as exemplified in b of FIG. 15, an edge of the mask 274 is adjusted to the boundary position $X_0$. Since the boundary position $X_0$ is present more on the side of the drain 240 than an edge, on the side of the source 220, of a gate insulating film 245, even if the position of the edge of the mask 274 is slightly shifted, it is less likely that upon implantation of ionized acceptors, the ions are implanted into the source 220. On the other hand, in the first embodiment in which the source-side N-type semiconductor region 261 is not provided, if the position of the edge of the mask is shifted upon the formation of the P-type semiconductor region 262, then there is a possibility of ions implanted into the source 220, too. If ionized acceptors are implanted into the N-type source 220, the conductivity of the source 220 decreases and the characteristics of the field effect transistor 200 deteriorate. By thus forming the source-side N-type semiconductor region 261, ions serving as acceptors can be suppressed from being implanted into the source 220.

Figure 16:
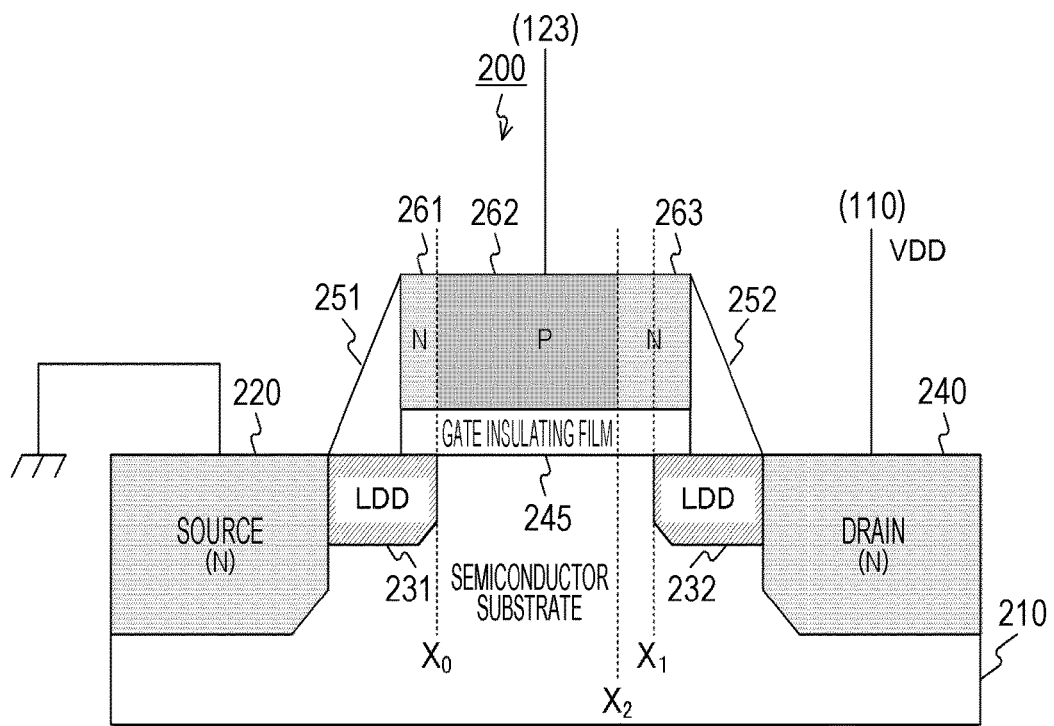
FIG. 16 is an example of a cross-sectional view of a field effect transistor in which the area of a drain-side N-type semiconductor region is increased in the second embodiment.

FIG. 16 is an example of a cross-sectional view of a field effect transistor in which the area of a drain-side N-type semiconductor region 263 is increased in the second embodiment. For example, with the boundary position of a source-side N-type semiconductor region 261 remaining at $X_0$, the boundary position of the drain-side N-type semiconductor region 263 is adjusted from $X_1$ to $X_2$.

As the area of the drain-side N-type semiconductor region 263 increases, as in the first embodiment, the leakage current is suppressed and the on-current increases. On the other hand, if the area of the source-side N-type semiconductor region 261 is increased, a potential difference of an opposite polarity to that of the drain-side N-type semiconductor region 263 occurs. Hence, in terms of suppressing the leakage current, the area of the source-side N-type semiconductor region 261 does not need to be made larger than that of the drain-side N-type semiconductor region 263.

Note that in a case where a field effect transistor 200 is of P-type, too, three semiconductor regions may be similarly provided in a gate. In this case, in the gate, a source-side P-type semiconductor region is formed on the source side, a drain-side P-type semiconductor region is formed on the drain side, and an N-type semiconductor region is formed therebetween.

Figure 17:
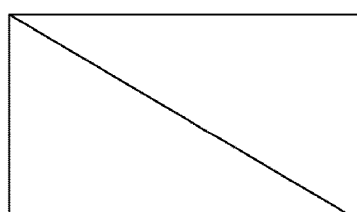
FIG. 17 is a diagram for describing relationships between the area of each of the drain-side N-type semiconductor region and a source-side N-type semiconductor region and a drain current in the second embodiment.

FIG. 17 is a diagram for describing relationships between the area of each of the drain-side N-type semiconductor region 263 and the source-side N-type semiconductor region 261 and a drain current in the second embodiment. With the area of the gate insulating film 245 being fixed, as the area of the drain-side N-type semiconductor region 263 increases, as in the first embodiment, the leakage current is suppressed and the on-current increases. On the other hand, as the area of the source-side N-type semiconductor region 261 increases, the leakage current increases and the on-current also increases. On the basis of these relationships, the area of each of the source-side N-type semiconductor region 261 and the drain-side N-type semiconductor region 263 is adjusted such that the on-current increases in a range in which the leakage current is suppressed to be less than or equal to an allowable value.

As such, according to the second embodiment, since the source-side N-type semiconductor region 261 is further provided, by adjustment of the area of each of the source-side N-type semiconductor region 261 and the drain-side N-type semiconductor region 263, both the increase in on-current and the suppression of leakage current can be achieved.

<3. Third Embodiment>

Although in the above-described first embodiment two semiconductor regions are formed in a gate 260, three metal regions may be formed in the gate 260. A field effect transistor 200 of this third embodiment differs from that of the first embodiment in that the gate 260 has three metal regions.

Figure 18:
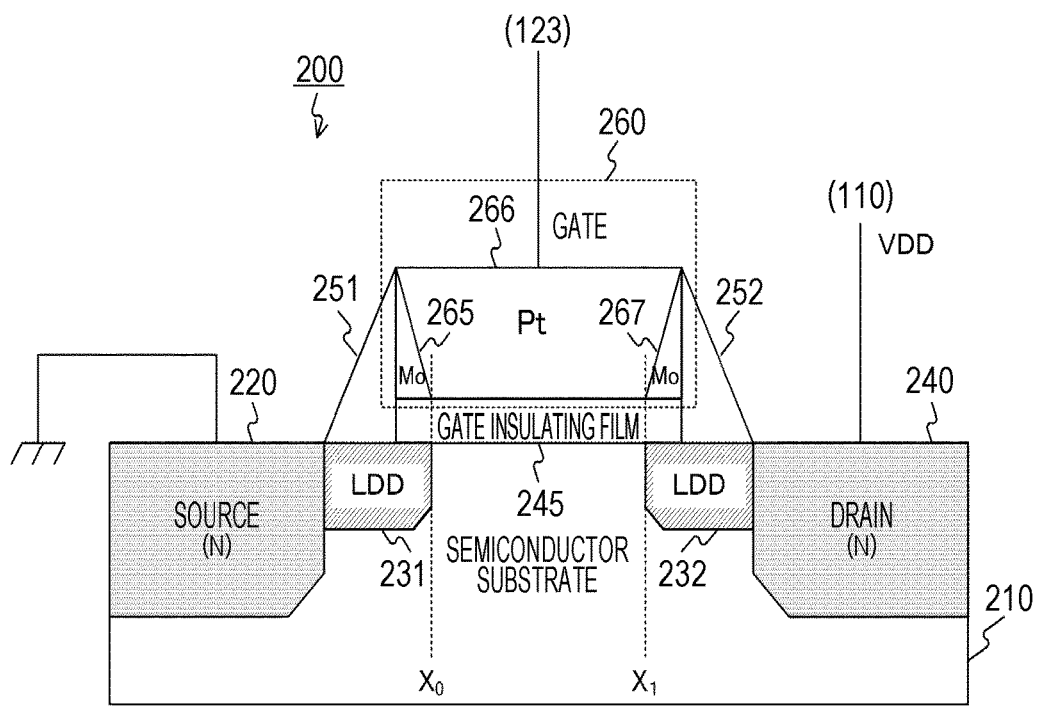
FIG. 18 is an example of a cross-sectional view of a field effect transistor in a third embodiment.

FIG. 18 is an example of a cross-sectional view of a field effect transistor 200 in the third embodiment. The field effect transistor 200 of the third embodiment differs from that of the first embodiment in that a gate 260 has a source-side region 265, an intermediate region 266, and a drain-side region 267.

The source-side region 265 is provided in a region ranging from an edge, on the side of a source 220, of a gate insulating film 245 to a boundary position X0, and the drain-side region 267 is provided in a region ranging from an edge, on the side of a drain 240, of the gate insulating film 245 to a boundary position X1. In addition, the intermediate region 266 is provided in a region ranging to the boundaries.

The source-side region 265 and the drain-side region 267 are formed of metals (e.g., molybdenum) with the same work function. In addition, the intermediate region 266 is formed of a metal (e.g., platinum) with a larger work function than the source-side region 265 and the drain-side region 267. Note that the regions may be formed of metals other than molybdenum and platinum.

In addition, in a P-type field effect transistor 200, three metal regions may be provided. In this case, an intermediate region 266 is formed of a metal with a smaller work function than a source-side region 265 and a drain-side region 267.

In addition, although the three regions, the source-side region 265, the intermediate region 266, and the drain-side region 267, are formed in the gate 260, only two of them may be provided. In a case where a field effect transistor 200 is of N-type, only the intermediate region 266 and the drain-side region 267 are provided, and in a case of P-type, only the source-side region 265 and the intermediate region 266 are provided.

In addition, although the source-side region 265 and the drain-side region 267 have the same area, they may be configured to have different areas. The areas are adjusted, as in the second embodiment, to suppress the leakage current and increase the on-current.

Figure 19:
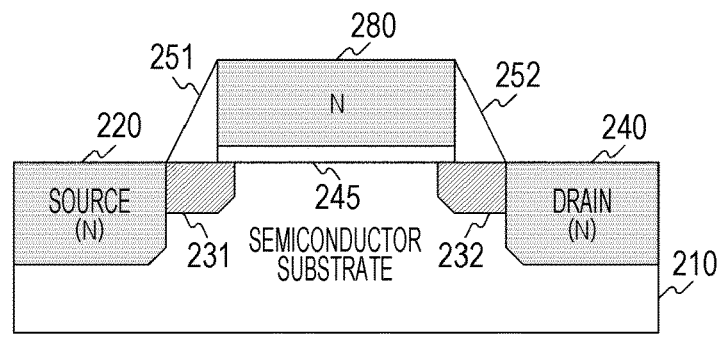
FIG. 19 is a diagram for describing a part of a manufacturing method up to chemical mechanical planarization of a field effect transistor in the third embodiment.
Figure 19:
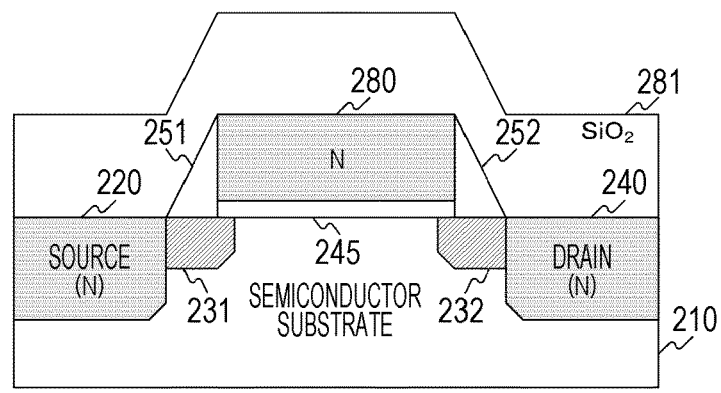
Figure 19:
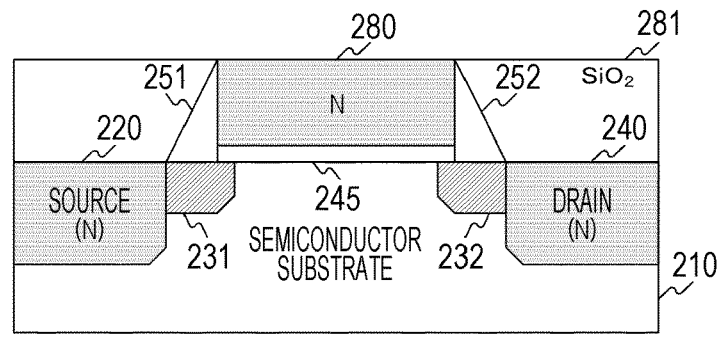

FIG. 19 is a diagram for describing a part of a manufacturing method up to chemical mechanical planarization of the field effect transistor 200 in the third embodiment. After the formation of sidewall spacers 251 and 252, an ion implantation apparatus ionizes and implants donors and thereby forms a source 220 and a drain 240 and an N-type semiconductor region 280.

Then, as exemplified in b of FIG. 19, a deposition apparatus deposits a silicon dioxide film 281. Then, as exemplified in c of the drawing, a chemical mechanical planarization (CMP) apparatus performs chemical mechanical planarization on the silicon dioxide film 281 and thereby allows the N-type semiconductor region 280 to be exposed.

Figure 20:
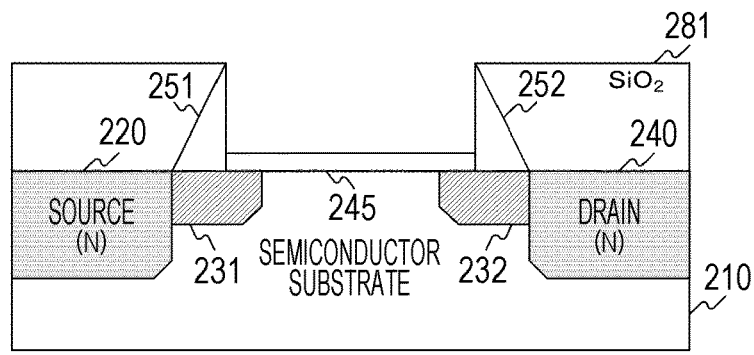
FIG. 20 is a diagram for describing a part of the manufacturing method up to the formation of a source-side region and a drain-side region of the field effect transistor in the third embodiment.
Figure 20:
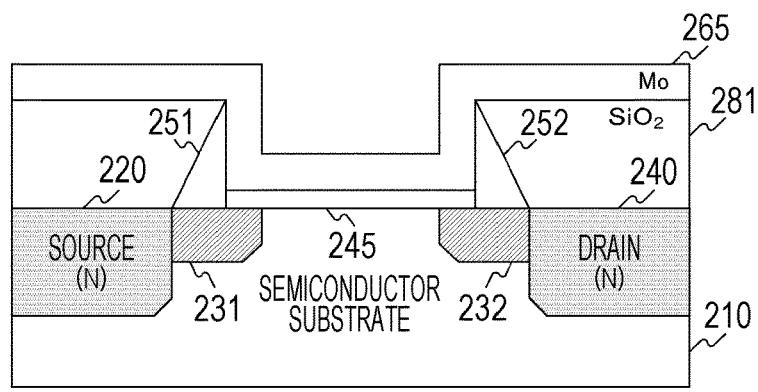
Figure 20:
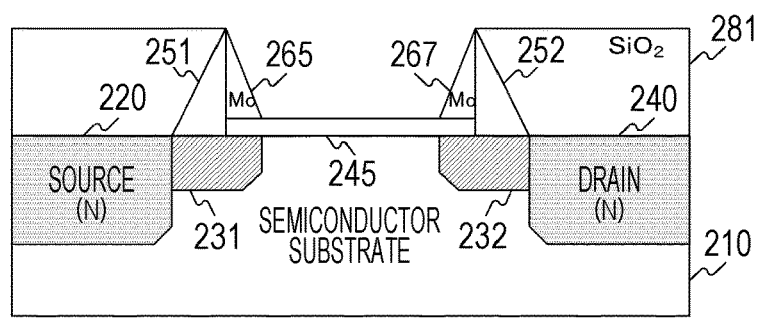

FIG. 20 is a diagram for describing a part of the manufacturing method for generating up to a source-side region 265 and a drain-side region 267 of the field effect transistor 200 in the third embodiment. After the CMP, as exemplified in a of the drawing, an etching apparatus removes the N-type semiconductor region 280 by selective etching. Then, as exemplified in b of the drawing, a sputtering apparatus performs sputtering to deposit molybdenum. As exemplified in c of the drawing, by anisotropic etching by the etching apparatus, the molybdenum is removed such that only a portion of the molybdenum around the sidewall spacers 251 and 252 remains. By this, a source-side region 265 and a drain-side region 267 are formed.

Figure 21:
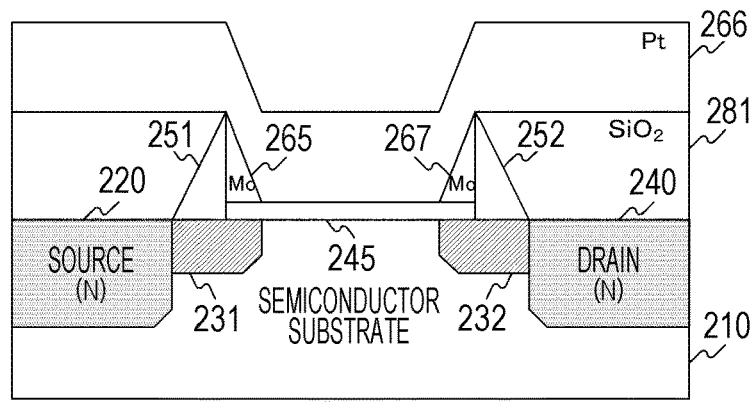
FIG. 21 is a diagram for describing a part of the manufacturing method after the formation of the source-side region and the drain-side region of the field effect transistor in the third embodiment.
Figure 21:
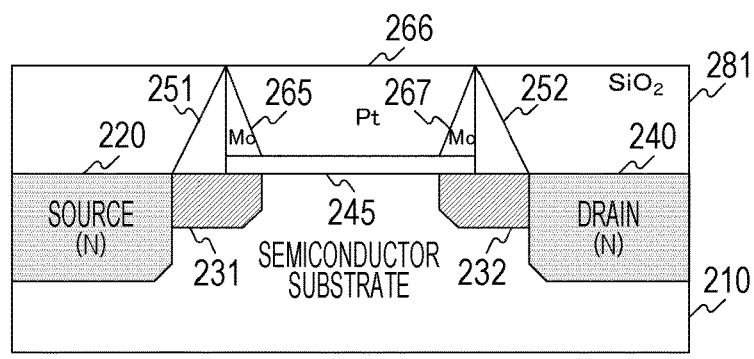
Figure 21:
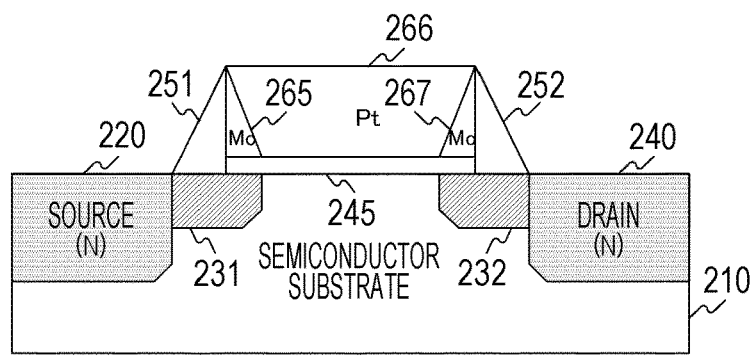

FIG. 21 is a diagram for describing a part of the manufacturing method after the formation of the source-side region 265 and the drain-side region 267 of the field effect transistor 200 in the third embodiment. As exemplified in a of the drawing, the sputtering apparatus deposits platinum by sputtering. Then, as exemplified in b of the drawing, the CMP apparatus performs chemical mechanical planarization to allow the silicon dioxide film 281 to be exposed. By this, an intermediate region 266 is formed. Then, as exemplified in c of the drawing, the silicon dioxide film 281 is removed by etching, etc.

Figure 22:
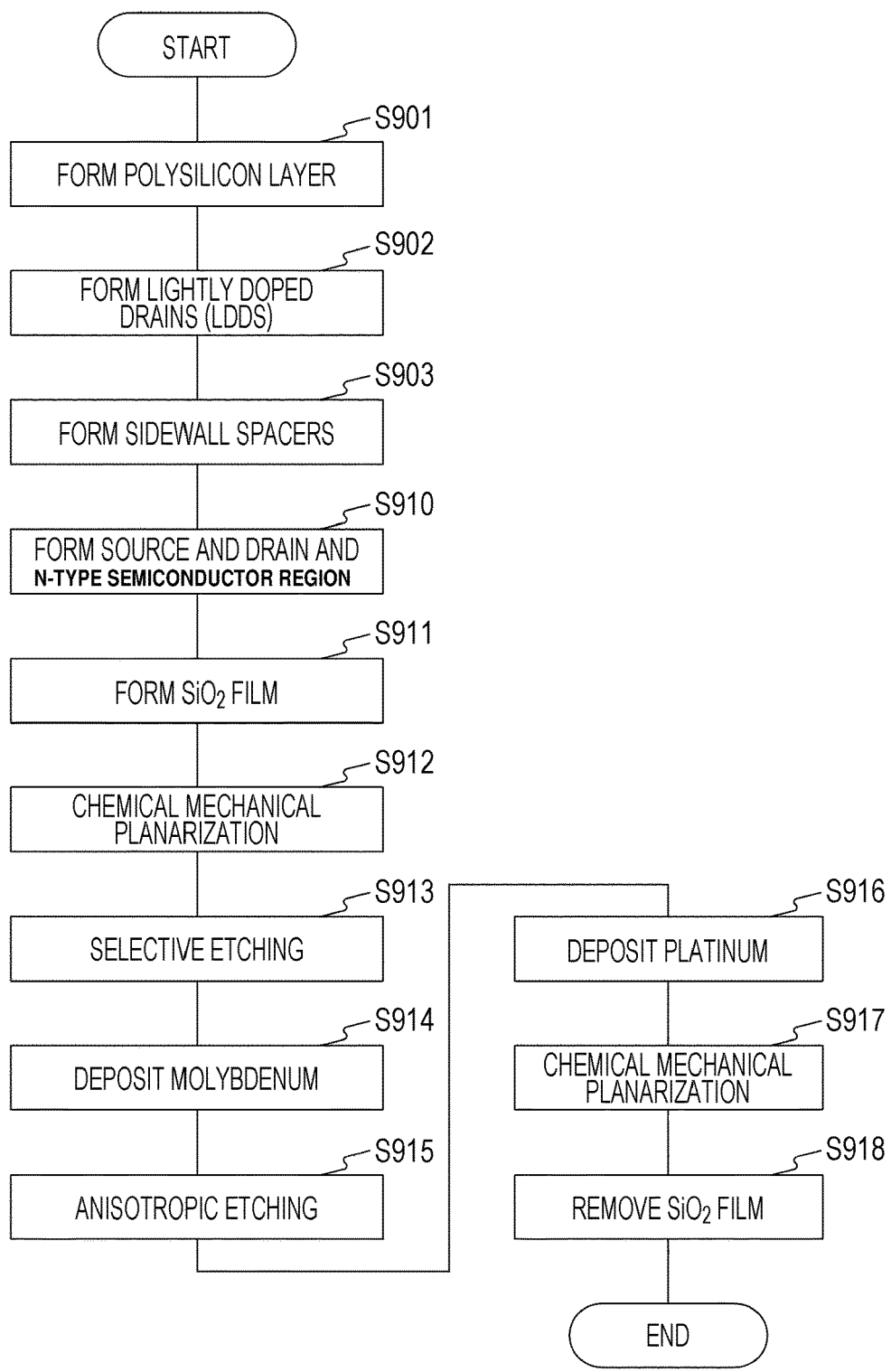
FIG. 22 is a flowchart showing an example of a method of manufacturing a field effect transistor in the third embodiment.

FIG. 22 is a flowchart showing an example of a method of manufacturing a field effect transistor in the third embodiment. The manufacturing method of the third embodiment differs from that of the first embodiment in that steps S910 to S918 are performed instead of steps S904 and S905.

After the formation of sidewall spacers 251 and 252 (step S903), by implantation of ionized donors, a source 220 and a drain 240 and an N-type semiconductor region 280 are formed (step S910). Then, a silicon dioxide film 281 is formed (step S911) and chemical mechanical planarization is performed (step S912).

Subsequently, by selective etching, the N-type semiconductor region 280 is removed (step S913) and molybdenum is deposited (step S914). By anisotropic etching, the molybdenum is removed such that only a portion of the molybdenum around the sidewall spacers 251 and 252 remains (step S915). By this, a source-side region 265 and a drain-side region 267 are formed.

Then, platinum is deposited (step S916) and chemical mechanical planarization is performed (step S917). Then, the silicon dioxide film 281 is removed (step S918).

As such, according to the third embodiment of the present technology, since the source-side region 265, the intermediate region 266, and the drain-side region 267 with different work functions are provided, by adjustment of the areas thereof, both the increase in on-current and the suppression of leakage current can be achieved.

Note that the above-described embodiments show examples for embodying the present technology, and the matters in the embodiments and the invention-identifying matters in the claims have a correspondence relationship with each other. Likewise, the invention-identifying matters in the claims and the matters in the embodiments of the present technology that are given the same names as the invention-identifying matters have a correspondence relationship with each other. Note, however, that the present technology is not limited to the embodiments, and can be embodied by making various modifications to the embodiments without departing from the true spirit and scope of the present technology.

Note that the effects are not necessarily limited to those described here and may be any of the effects described in the present disclosure.

Note that the present technology can also employ the following configurations:

(1) A transistor including:
  a source;
  a drain;
  a gate insulating film disposed between the source and the drain; and
  a gate provided on a surface of the gate insulating film and having a plurality of regions with different work functions.
(2) The transistor according to (1), in which the plurality of regions include two regions.
(3) The transistor according to (2),
  in which one of the two regions is an N-type semiconductor region disposed on a side of the drain,
  another one of the two regions is a P-type semiconductor region disposed on a side of the source, and
  the drain and the source are formed of N-type semiconductors.
(4) The transistor according to (2),
  in which one of the two regions is an N-type semiconductor region disposed on a side of the source,
  another one of the two regions is a P-type semiconductor region disposed on a side of the drain, and
  the drain and the source are formed of P-type semiconductors.
(5) The transistor according to (1), in which the plurality of regions include a drain-side region disposed on a side of the drain, a source-side region disposed on a side of the source, and an intermediate region disposed between the drain-side region and the source-side region.
(6) The transistor according to (5),
  in which the drain-side region and the source-side region and the source and the drain are formed of N-type semiconductors, and
  the intermediate region is formed of a P-type semiconductor.
(7) The transistor according to (5),
  in which the drain-side region and the source-side region and the source and the drain are formed of P-type semiconductors, and
  the intermediate region is formed of an N-type semiconductor.
(8) The transistor according to any of (5) to (7), in which the drain-side region and the source-side region have different areas.
(9) The transistor according to any of (1) to (8), in which the plurality of regions are formed of metals with different work functions.
(10) A protection circuit including:
  a power line connected to a power supply;
  a ground line with a predetermined potential;
  a source connected to the power line;
  a drain connected to the ground line;
  a gate insulating film disposed between the source and the drain; and
  a gate provided on a surface of the gate insulating film and having a plurality of regions with different work functions.
(11) The protection circuit according to (10), further including a capacitive element that delays an electrical signal input through the power line,
  in which the delayed electrical signal is input to the gate.
(12) A method of manufacturing a transistor, the method including:
  a silicon layer forming step of forming a silicon layer on a gate insulating film on a surface of a semiconductor substrate;
  a first adding step of adding a predetermined impurity to a part of the silicon layer and a predetermined region of the semiconductor substrate; and
  a second adding step of adding an impurity different than the predetermined impurity to a portion of the silicon layer excluding the part.
(13) A method of manufacturing a transistor, the method including:
  a first depositing step of depositing a predetermined metal on a gate insulating film on a surface of a semiconductor substrate;
  an etching step of removing, by etching, the predetermined metal such that a part of the predetermined metal remains; and
  a second depositing step of depositing a metal different than the predetermined metal on a surface of the gate insulating film.

REFERENCE SIGNS LIST

100 Electronic apparatus
110 Power supply circuit
120 Electrostatic discharge protection circuit
121 Resistor
122 Capacitive element
123 Inverter
130 Processing circuit
200, 201 Field effect transistor
210, 211 Semiconductor substrate
220, 221 Source
231, 232 Lightly doped drain
240, 241 Drain
245 Gate insulating film
251, 252 Sidewall spacer
260 Gate
261 Source-side N-type semiconductor region
262 P-type semiconductor region
263 Drain-side N-type semiconductor region
264 Polysilicon layer
265 Source-side region
266 Intermediate region
267 Drain-side region
268, 280 N-type semiconductor region
269 Source-side P-type semiconductor region
271, 272, 273, and 274 Mask
281 Silicon dioxide film

The invention claimed is:
1. A transistor comprising:
  a source;
  a drain;
  a gate insulating film disposed between the source and the drain;
  a gate provided on a surface of the gate insulating film and having a plurality of regions with different work functions; and
  a first lightly doped drain disposed between the source and the gate insulating film and a second lightly doped drain disposed between the drain and the gate insulating film, wherein locations of two of the regions from the plurality of regions with different work functions are based on a position of the second lightly doped drain.
2. The transistor according to claim 1, wherein the plurality of regions include two regions.
3. The transistor according to claim 2,
  wherein one of the two regions is an N-type semiconductor region disposed on a side of the drain,
  another one of the two regions is a P-type semiconductor region disposed on a side of the source, and the drain and the source are formed of N-type semiconductors.

4. The transistor according to claim 2,
wherein one of the two regions is an N-type semiconductor region disposed on a side of the source,
another one of the two regions is a P-type semiconductor region disposed on a side of the drain, and
the drain and the source are formed of P-type semiconductors.

5. The transistor according to claim 1, wherein the plurality of regions include a drain-side region disposed on a side of the drain, a source-side region disposed on a side of the source, and an intermediate region disposed between the drain-side region and the source-side region.

6. The transistor according to claim 5,
wherein the drain-side region and the source-side region and the source and the drain are formed of N-type semiconductors, and
the intermediate region is formed of a P-type semiconductor.

7. The transistor according to claim 5,
wherein the drain-side region and the source-side region and the source and the drain are formed of P-type semiconductors, and
the intermediate region is formed of an N-type semiconductor.

8. The transistor according to claim 5, wherein the drain-side region and the source-side region have different areas.

9. The transistor according to claim 1, wherein the plurality of regions are formed of metals with different work functions.

10. The transistor according to claim 1, wherein the first lightly doped drain and the second lightly doped drain are within a semiconductor substrate.

11. The transistor according to claim 10, wherein at least a portion of each of the first lightly doped drain and the second lightly doped drain are below the gate insulating film.

12. The transistor according to claim 10, wherein a first sidewall spacer is in contact with the gate, the gate insulating film, and the first lightly doped drain, and wherein a second sidewall spacer is in contact with the gate, the gate insulating film, and the second lightly doped drain.

13. The transistor according to claim 10, wherein a boundary of the locations is substantially aligned with a boundary of the second lightly doped drain within the semiconductor substrate.

14. The transistor according to claim 1, further comprising a first sidewall spacer provided on a side of the source and adjacent to the gate, and a second sidewall spacer provided on a side of the drain and adjacent to the gate.

15. The transistor according to claim 1, wherein the a boundary of the locations is substantially aligned with a side wall of the second lightly doped drain.

16. The transistor according to claim 1, wherein a leakage current from the drain to the source is reduced by the locations.

17. A protection circuit comprising:
a power line connected to a power supply;
a ground line with a predetermined potential;
a source connected to the power line;
a drain connected to the ground line;
a gate insulating film disposed between the source and the drain;
a gate provided on a surface of the gate insulating film and having a plurality of regions with different work functions; and
a first lightly doped drain disposed between the source and the gate insulating film and a second lightly doped drain disposed between the drain and the gate insulating film, wherein locations of two of the regions from the plurality of regions with different work functions are based on a position of the second lightly doped drain.

18. The protection circuit according to claim 17, further comprising a capacitive element that delays an electrical signal input through the power line,
wherein the delayed electrical signal is input to the gate.

19. A method of manufacturing a transistor, the method comprising:
a silicon layer forming step of forming a silicon layer on a gate insulating film on a surface of a semiconductor substrate;
a first adding step of adding a predetermined impurity to a part of the silicon layer and a predetermined region of the semiconductor substrate;
a second adding step of adding an impurity different than the predetermined impurity to a portion of the silicon layer excluding the part,
wherein the semiconductor substrate comprises a first lightly doped drain and a second lightly doped drain, and
wherein locations of the impurity and the predetermined impurity are based on a position of the second lightly doped drain.

20. A method of manufacturing a transistor, the method comprising:
a first depositing step of depositing a predetermined metal on a gate insulating film on a surface of a semiconductor substrate;
an etching step of removing, by etching, the predetermined metal such that a part of the predetermined metal remains; and
a second depositing step of depositing a metal different than the predetermined metal on a surface of the gate insulating film,
wherein the semiconductor substrate comprises a first lightly doped drain disposed between a source and the gate insulating film and a second lightly doped drain disposed between a drain and the gate insulating film, wherein the metal and the predetermined metal have different work functions and locations of the metal and the predetermined metal are based on a position of the second lightly doped drain.

* * * * *